(12) United States Patent
Kwon et al.

(10) Patent No.: US 7,170,070 B2
(45) Date of Patent: Jan. 30, 2007

(54) ION IMPLANTERS HAVING AN ARC CHAMBER THAT AFFECTS ION CURRENT DENSITY

(75) Inventors: Ui-hui Kwon, Gyeonggi-do (KR); Gyeong-su Keum, Gyeonggi-do (KR); Won-young Chung, Gyeonggi-do (KR); Kwang-ho Cha, Gyeonggi-do (KR); Young-tae Kim, Gyeonggi-do (KR); Seung-ki Chae, Seoul (KR); Jai-hyung Won, Seoul (KR); Young-kwan Park, Gyeonggi-do (KR); Tai-kyung Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/227,511

(22) Filed: Sep. 15, 2005

(65) Prior Publication Data

US 2006/0060797 A1    Mar. 23, 2006

(30) Foreign Application Priority Data

Sep. 20, 2004    (KR) .................. 10-2004-0075116

(51) Int. Cl.
*H01J 37/28* (2006.01)
(52) U.S. Cl. ............... 250/492.21; 250/423 R; 250/426
(58) Field of Classification Search ........... 250/492.21, 250/423 R, 426
See application file for complete search history.

(56) References Cited

U.S. PATENT DOCUMENTS 5,523,646 A * 6/1996 Tucciarone .............. 313/359.1
6,237,527 B1   5/2001 Kellerman et al.

FOREIGN PATENT DOCUMENTS

| JP | 9-245705 A | 9/1997 |
|----|------------|--------|
| JP | 10-302658 A | 11/1998 |
| KR | 2003-0054585 A | 7/2003 |
| WO | WO 01/15200 A1 | 3/2001 |

* cited by examiner

*Primary Examiner*—Kiet T. Nguyen
(74) *Attorney, Agent, or Firm*—Myers Bigel Sibley & Sajovec, P.A.

(57) ABSTRACT

The present invention can provide ion implanter devices including an arc chamber including at least a first inner region and a second inner region, an electron emitting device disposed in the arc chamber adjacent the first inner region and adapted to emit electrons, an electron returning device disposed in the arc chamber adjacent the second inner region and adapted to return at least some of the electrons emitted from the electron emitting device into the second inner region; and an electric field and magnetic field generating device adapted to provide a magnetic field to the arc chamber, wherein at least one inner wall of the arc chamber has a convex surface.

21 Claims, 8 Drawing Sheets

ION IMPLANTERS HAVING AN ARC CHAMBER THAT AFFECTS ION CURRENT DENSITY

CROSS REFERENCE TO RELATED APPLICATION

This application claims priority from Korean Patent Application No. 10-2004-0075116, filed Sep. 20, 2004, the disclosure of which is incorporated herein by reference in its entirety.

FIELD OF THE INVENTION

The present invention relates to ion implanters, and more particularly, to ion implanters having a configuration that affects ion current density.

BACKGROUND OF THE INVENTION

Generally, fabrication processes of semiconductor devices may involve an ion implantation process. During the ion implantation process, p-type impurities, such as boron (B) and indium (In), or n-type impurities, such as phosphorus (P) and arsenic (As), may be ionized and implanted into a silicon wafer. Such an ion implantation process may be used because it may be less difficult to control the concentration of impurities implanted into a silicon wafer.

An ion implanter for implementing the ion implantation process may include an arc chamber from which ion sources (i.e., positive ions) may be emitted. In the arc chamber, electrons emitted from a filament may be forcibly collided with a neutralized reactant gas so that thermoelectrons are separated from the reactant gas, thereby producing and emitting positive ions.

However, in a conventional ion implanter, a number of thermoelectrons emitted from a filament in an arc chamber may be lost through a body of the arc chamber before colliding with a reactant gas. Due, at least in part, to the loss of the thermoelectrons, the current density of positive ions emitted from the arc chamber may be reduced.

SUMMARY OF THE INVENTION

Embodiments of the present invention provide ion implanters including an arc chamber that improves ion current density.

According to some embodiments of the present invention, the arc chamber includes at least a first inner region and a second inner region, an electron emitting device disposed in the arc chamber adjacent the first inner region and adapted to emit electrons, an electron returning device disposed in the arc chamber adjacent the second inner region and adapted to return at least some of the electrons emitted from the electron emitting device into the second inner region and an electric field and magnetic field generating device adapted to provide a magnetic field to the arc chamber, wherein at least one inner wall of the arc chamber has a convex surface. In some embodiments, the ion implanter includes an arc chamber including an interior region including a filament in one inner region of the interior region adapted to emit thermoelectrons and a repeller in a second inner region of the interior region positioned opposite the filament and adapted to prevent consumption of at least some of the thermoelectrons.

Some embodiments of the present invention further provide an ion implanter including an arc chamber, as described above, further including an electric field and magnetic field generating device adapted to direct outward lines of magnetic force along at least one inner wall of the arc chamber in a convex distribution pattern, wherein the at least one inner wall of the arc chamber is disposed parallel-to the lines of magnetic force applied between the electron emitting device and the electron returning device. In some embodiments, the ion implanter includes an electromagnet installed outside the arc chamber including the filament and the repeller, and the electromagnet thereby enables lines of magnetic force to distribute in an outwardly convex pattern.

According to some embodiments of the present invention, the ion implanter includes an arc chamber, an electron emitting device and an electron returning device as described above, and further includes an electric field and magnetic field generating device disposed external to the arc chamber and adapted to direct outward lines of magnetic force in a convex distribution pattern in a direction between the electron emitting device and the electron returning device and away from the interior of the arc chamber, wherein the arc chamber includes at least one inner wall conformed to the outermost lines of magnetic force applied between the electron emitting device and the electron returning device.

In some embodiments of the present invention, the ion implanter includes an arc chamber, an electron emitting device, an electron returning device, and an electric field and magnetic field generating device disposed external to the arc chamber and adapted to direct outward lines of magnetic force in a convex distribution pattern in a direction away from the interior of the arc chamber, wherein the arc chamber includes at least one inner wall having a convex surface thereby reducing the loss of electrons in a region where the lines of magnetic force intersect the at least one inner wall.

In some embodiments, the ion implanters described above further include a tool adapted to conform at least one inner wall of the arc chamber to the lines of magnetic force in the arc chamber applied between the electron emitting device and the electron returning device. The tool may be formed of the same material as a body of the arc chamber and may be installed in conformity to the outermost lines of magnetic force that penetrate the filament and the repeller.

According to some embodiments of the present invention, the ion implanter described above may further include a gas supply system adapted to direct a source gas into the arc chamber, and an ion extraction outlet extending through a sidewall of the arc chamber adapted to extract ions from the arc chamber, wherein a positive voltage is applied to at least one inner wall of the arc chamber to accelerate electron emission from an electron emitting device thereby providing energy to the electrons for ionization of the source gas, and wherein the at least one inner wall of the arc chamber has a convex surface thereby reducing the loss of thermoelectrons in a region where the lines of magnetic force intersect the at least one inner wall.

DETAILED DESCRIPTION OF EMBODIMENTS ACCORDING TO THE INVENTION

Figure 1:
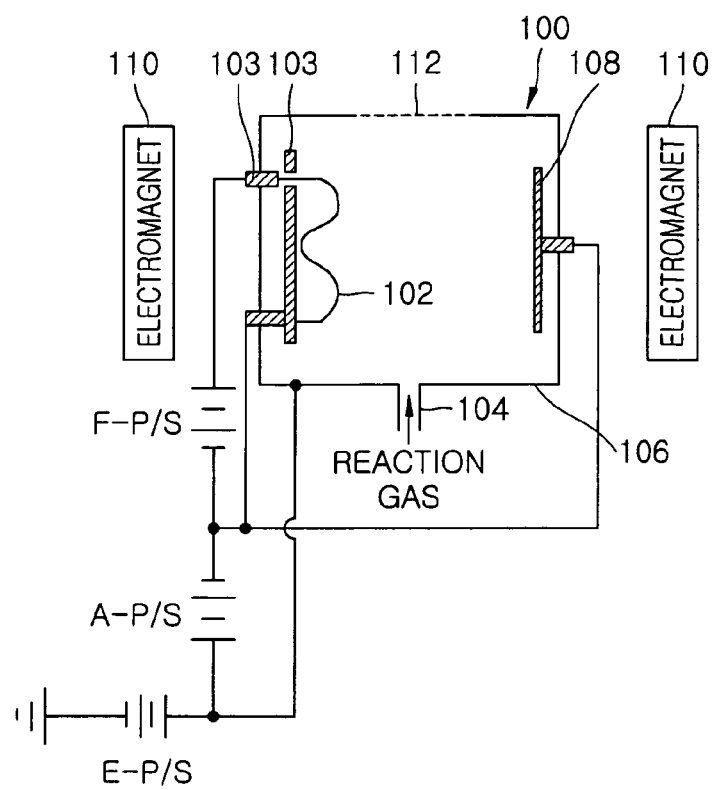
FIG. 1 presents a schematic view of a conventional ion implanter.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "up", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Moreover, it will be understood that steps comprising the methods provided herein can be performed independently or at least two steps can be combined. Additionally, steps comprising the methods provided herein, when performed independently or combined, can be performed at the same temperature and/or atmospheric pressure or at different temperatures and/or atmospheric pressures without departing from the teachings of the present invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 presents a schematic view of a conventional ion implanter. More specifically, the conventional ion implanter includes an arc chamber 100 having a predetermined internal space. Further, filament 102, from which thermoelectrons can be emitted using thermionic emission, may be installed along one inner region of the arc chamber 100. The filament 102 may be formed of tungsten or other suitable material. The thermionic emission may occur when Joule heating is generated by supplying a sufficient current to the filament using a filament power supply (F-P/S) and an electrode 103.

Thermoelectrons emitted from the filament 102 may be accelerated in order to obtain energy sufficient to ionize a reactant gas, which may be injected into the arc chamber 100 through a gas inlet 104 located below the arc chamber 100. To accelerate the thermoelectrons, a high positive voltage, for example, 60 to 150 V, may be applied to a body 106 of the arc chamber 100 using an ARC power supply (A-P/S).

In order to prevent the thermoelectrons emitted from the filament 102 from being lost through the body 106 of the arc chamber 100, a repeller 108 to which a negative voltage, for example, −5V, may be applied is installed on the opposite side of the filament 102. The repeller 108 applies a negative voltage using the filament power supply (F-P/S) or the arc power supply (A-P/S). An external power supply (E-P/S) may be connected to the filament power supply (F-P/S) and the arc power supply (A-P/S).

Electromagnets 110 may be installed outside the arc chamber 100. The electromagnets 110 are capable of applying magnetic fields of varied strength from the filament 102 toward the repeller 108. The magnetic fields may be applied to effectuate the collision of thermoelectrons with the reactant gas.

In the ion implanter, the thermoelectrons emitted from the filament 102 may collide with the neutralized reactant gas in the arc chamber 100 so that electrons are forcibly separated from the reactant gas, thereby producing positive ions. The positive ions produced may be emitted through an extraction slit 112 located on an upper surface of the arc chamber 100.

Figure 2:
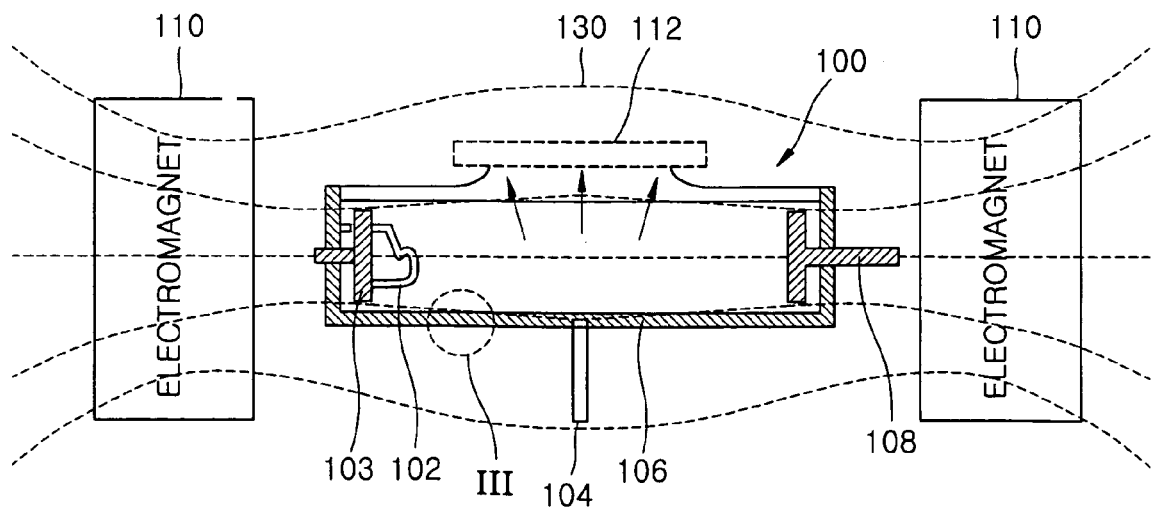
FIGS. 2 and 3 illustrate the directions in which thermoelectrons move within the distribution of magnetic fields of a conventional ion implanter, such as the ion implanter shown in FIG. 1.
Figure 3:
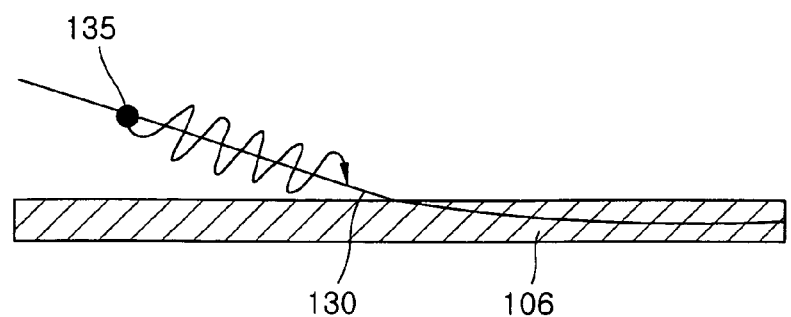

FIGS. 2 and 3 illustrate the directions in which thermoelectrons can move in the distribution of magnetic fields of a conventional ion implanter as shown in FIG. 1.

Specifically, referring to FIGS. 2 and 3, the same reference numerals are used to denote the same structures noted in FIG. 1. FIG. 3 presents an expanded view of a portion "III" shown in FIG. 2. The arrows illustrated in the arc chamber 100 denote the direction in which positive ions move, and reference numeral 130 refers to lines of magnetic force.

Generally, a thermoelectron (135 of FIG. 3) emitted from the filament 102 in the arc chamber 100 is subjected to Lorentz force (F) as expressed below in Equation 1 using an electric field vector (E) and a magnetic field vector (B). The thermoelectron 135 may have a small mass, because, at least in part, a radius of revolution of the thermoelectron 135 due to the Lorentz force F may be decreased. Accordingly, the thermoelectron 135 tends to move along a line of magnetic force 130. This phenomenon may be referred to as magnetic confinement.

$$F=q(E+v\times B) \quad (1),$$

wherein v is a velocity vector of a thermoelectron.

The lines of magnetic force 130 caused by magnetic fields applied to the arc chamber 100 by the electromagnets 110 may distribute in a convex pattern outside the arc chamber 100 due to, at least in part, the limitation of the capacity of the electromagnets 110. Thus, in a region where the line of magnetic force 130 runs across the body 106 of the arc chamber 100, the loss of the thermoelectron 135 may occur as shown in FIG. 3. In particular, the thermoelectron 135 emitted from the filament 102 moves along the line of magnetic force 130 and may be consumed in the body 106 of the arc chamber 100 to which a positive voltage may be applied.

The more the arc chamber 100 is expanded to increase the current density of ions emitted from the arc chamber 100, the more the above-described phenomenon may become more serious, because, at least in part, the shape of an internal magnetic field may become more convex in an outwardly direction. In other words, as the capacity of the arc chamber 100 of a conventional ion implanter increases, the current density of ions emitted from the arc chamber 100 decreases.

Figure 4A:
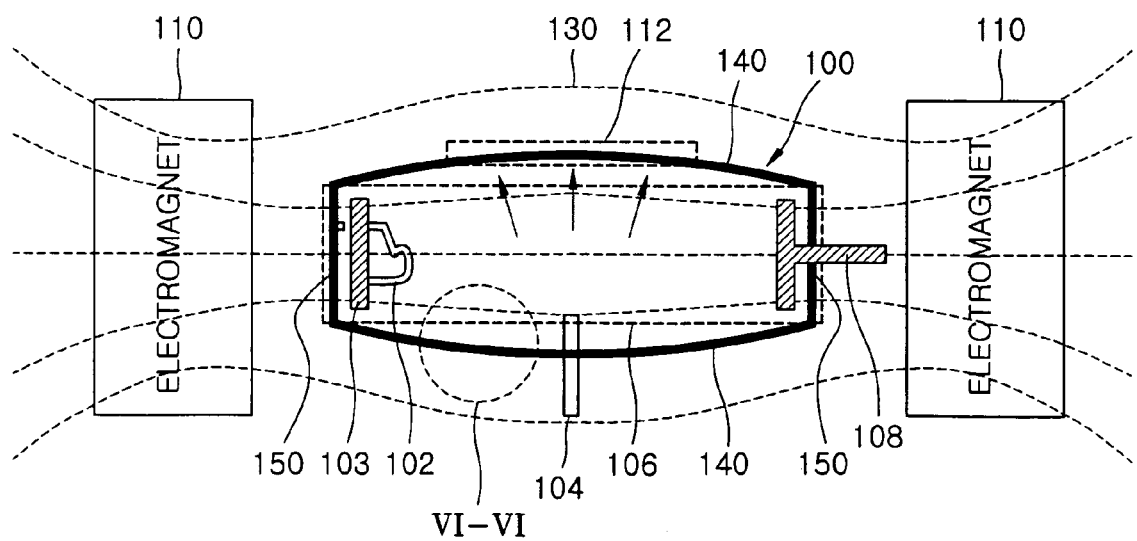
FIGS. 4A and 4B present schematic views of an ion implanter including an arc chamber according to some embodiments of the present invention.
Figure 4B:
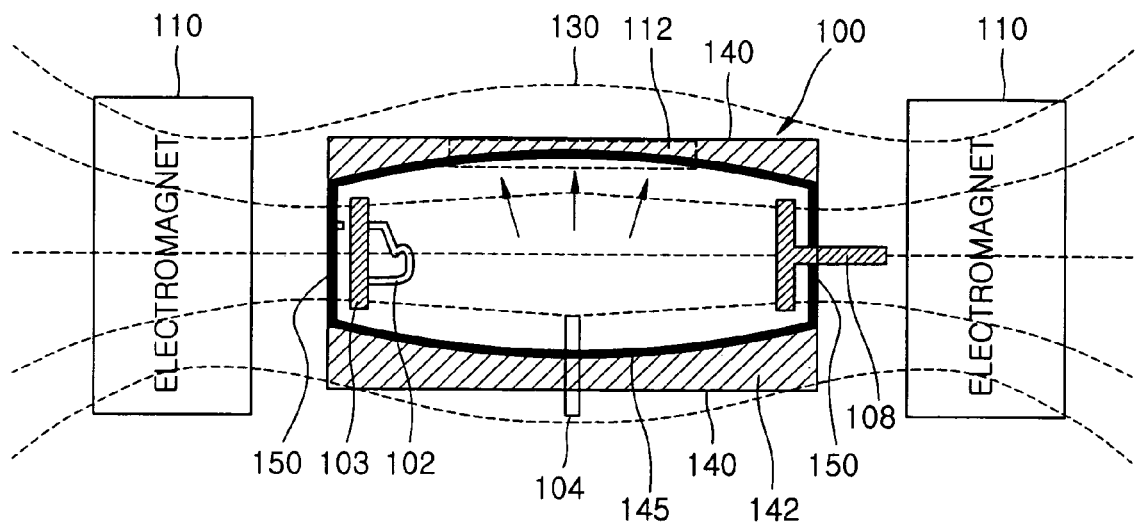
Figure 5:
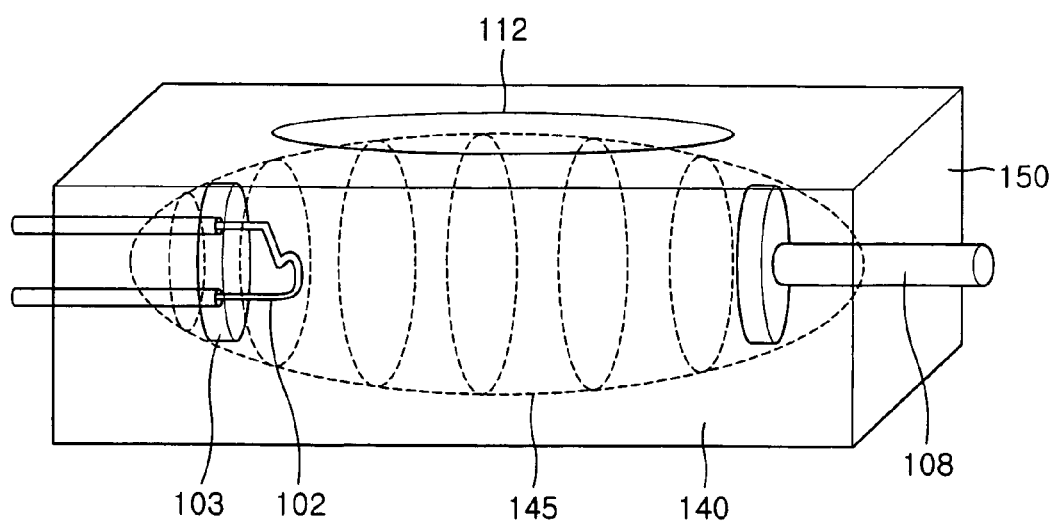
FIG. 5 presents a perspective view of an ion implanter including an arc chamber according to some embodiments of the present invention.
Figure 6:
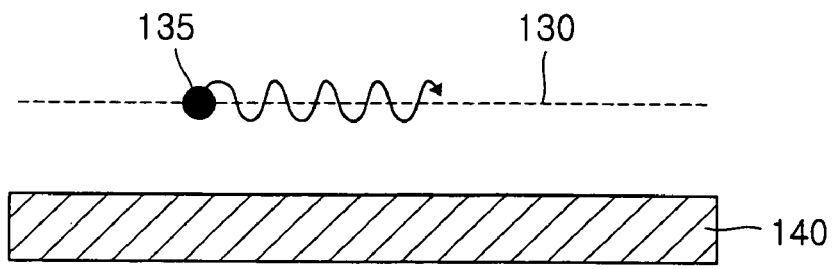
FIG. 6 presents an expanded view of a portion "VI—VI" of FIG. 4A, which illustrates the direction in which thermoelectrons move in magnetic fields of the ion implanter according to some embodiments of the present invention.

FIGS. 4A and 4B present schematic views of an ion implanter including an arc chamber 100 according to some embodiments of the present invention. FIG. 5 presents a perspective view of an ion implanter including an arc chamber 100 according to some embodiments of the present invention, and FIG. 6 presents an expanded view of a portion "VI—VI" of FIG. 4A, which illustrates the direction in which thermoelectrons move in magnetic fields of the ion implanters according to some of the embodiments of the present invention.

More specifically, in FIGS. 4A, 4B, 5, and 6, the same reference numerals are used to denote the same elements as noted in FIG. 1. The arrows illustrated in the arc chamber 100 denote the direction in which positive ions move, and reference numeral 130 refers to lines of magnetic force.

As described above, in the arc chamber 100, a thermoelectron (135 of FIG. 6) emitted from an electron emitting device or filament 102 tends to move along a line of magnetic force 130 because, at least in part, a radius of revolution of the thermoelectron 135 due to the Lorentz force F may be decreased. The lines of magnetic force 130 caused by magnetic fields applied to the arc chamber 100 by electromagnets 110 distribute in the shape of a convex pattern outside the arc chamber 100 due to, at least in part, the limitation of the capacity of the electromagnets 110, as shown in FIGS. 4A and 4B. Thus, in a region where the line of magnetic force 130 runs across a body 106 of the arc chamber 100, the loss of the thermoelectron 135 may occur as shown in FIG. 3.

However, bodies 140 and 150 of the arc chamber 100, according to some embodiments of the present invention, may be structured in a manner different from the body 106 of the arc chamber 100 of FIG. 3 in that the loss of the thermoelectrons 135 may be prevented by considering the shape of the magnetic fields. In some embodiments of the present invention, in order to reduce the loss of thermoelectrons 135 due to, at least in part, intersection between the lines of magnetic force 130 and the bodies 140 and 150, the body 140 or an inner wall 145 of the arc chamber 100 may be designed to be convex from the filament 102 toward an electron returning device or repeller 108 or from the repeller 108 toward the filament 102 outside the arc chamber 100.

FIG. 4A shows an embodiment where the body 140 of the arc chamber 100 is designed to be convex outside the arc chamber 100, while 4B shows an embodiment where the inner wall 145 of the arc chamber 100 is designed to be convex by inserting a shaping tool 142 formed of the same material as the body 140 into the bodies 140 and 150, which are expanded more than the body 106 of FIG. 2. FIG. 5 shows an embodiment where the inner wall 145 of the body 140 is designed to be: convex outward.

In particular, in the bodies 140 and 150 of the arc chamber 100 according to some embodiments of the present invention, the body 140 or the inner wall 145 of the arc chamber 100, which is disposed from the filament 102 toward the repeller 108 (or from the repeller 106 toward the filament 102), is designed parallel to the lines of magnetic force 130 that penetrate the filament 102 and the repeller 108. In other embodiments, the body 140 or the inner wall 145 of the arc chamber 100 are designed to conform their lines of curvature to the outermost lines of magnetic force 130, which may penetrate the filament 102 and the repeller 103 and resemble a convex structure such as a convex lens. The body 150 (or an inner wall) of the arc chamber 100 may be designed orthogonally to a line between the filament 102 and the repeller 108.

Once the body 140 or the inner wall 145 disposed from the filament 102 toward the repeller 108 is convexly formed, as shown in FIG. 6, even if the thermoelectron 135 emitted from the filament 102 moves along the line of magnetic force 130, the thermoelectron 135 may not be consumed in the body 140 of the arc chamber 100. Thus, the loss of thermoelectrons 135 may be reduced. In FIGS. 4A, 4B, and 5, reference numeral 104 refers to a gas inlet located at a lower surface of the arc chamber 100 and through which a source or reactant gas such as any suitable gas including boron (B), phosphorus (P), arsenic (As), antimony (Sb), etc. and inactive gases such as argon (Ar) and nitrogen ($N_2$) may be injected into the arc chamber 100, and 112 refers to an extraction slit located on an upper surface of the arc chamber 100 and through which positive ions may be emitted from the arc chamber 100.

Figure 7:
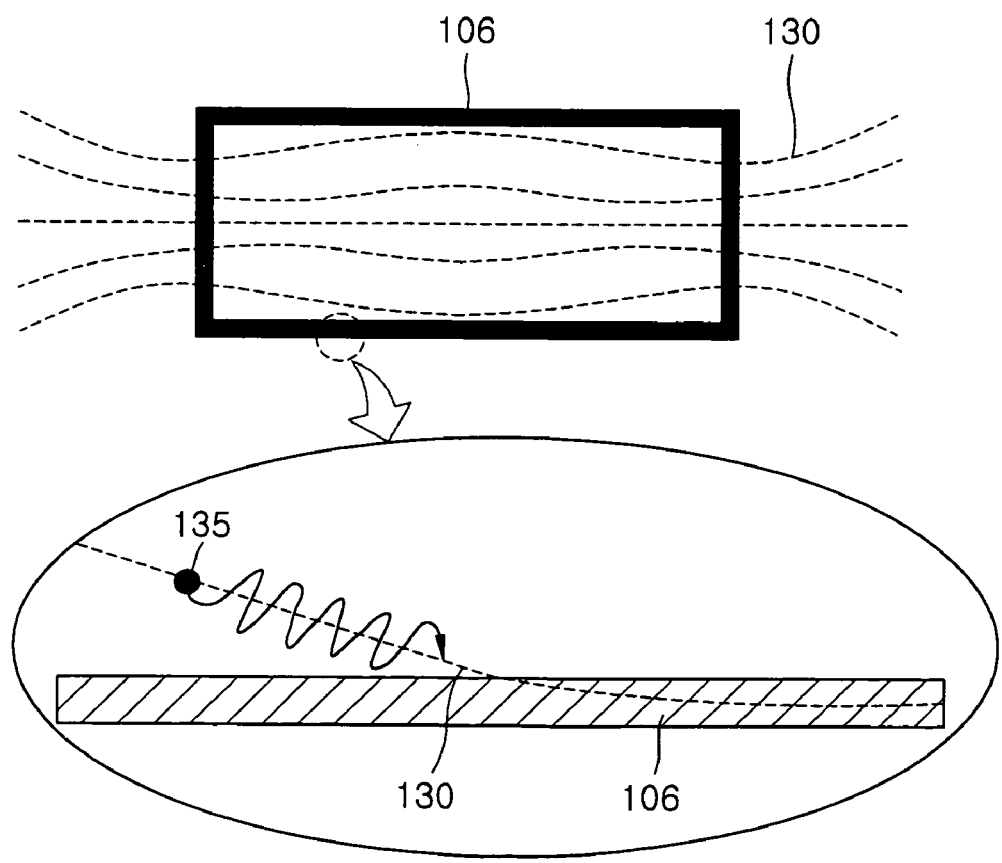
FIGS. 7 and 8 presents diagrams showing a comparison of magnetic field distribution and the direction in which thermoelectrons move in a conventional ion implanter (FIG. 7) and in an ion implanter according to some embodiments of the present invention (FIG. 8)
Figure 8:
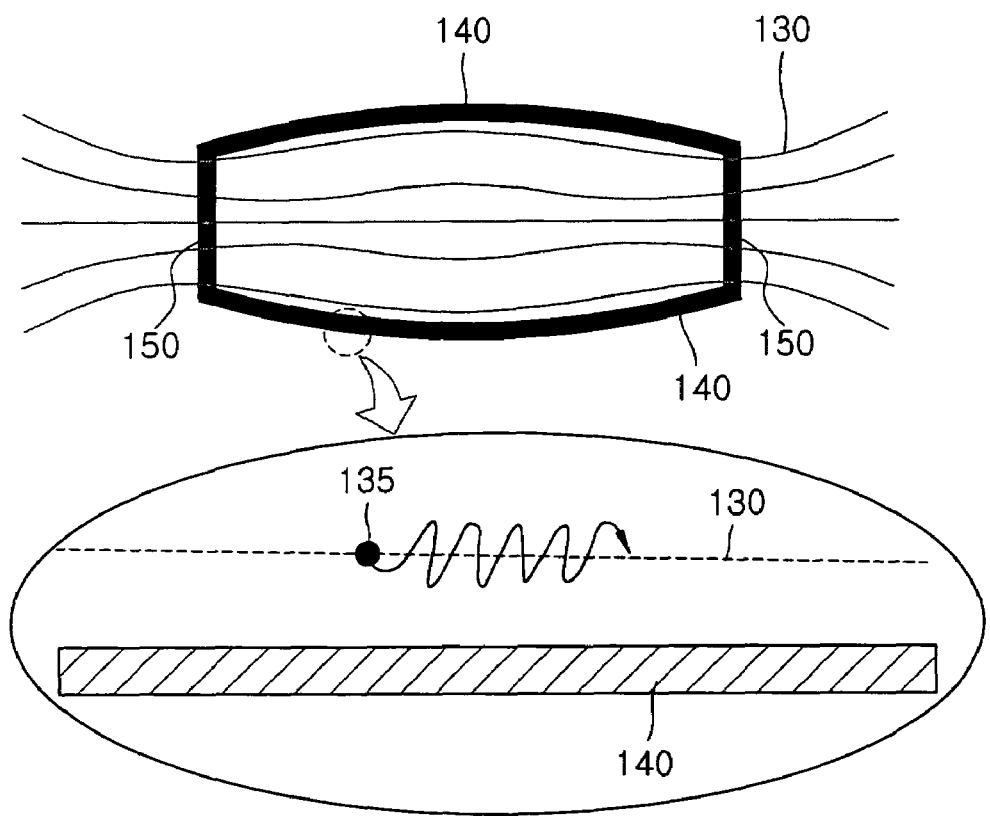

FIGS. 7 and 8 present diagrams for comparing magnetic field distribution and the direction in which thermoelectrons move between a conventional ion implanter and an ion implanter according to some embodiments of the present invention.

Referring to FIGS. 7 and 8, the same reference numerals are used to denote the same elements as in FIGS. 1 through 6. In the conventional ion implanter shown in FIG. 7, thermoelectrons 135 may be consumed within a body 106 of an arc chamber 100 in a region where lines of magnetic force 130 intersect the body 106. In contrast, in the ion implanter according to some embodiments of the present invention as shown in FIG. 8, since a body 140 (or the inner wall 145 of FIGS. 4B and 5) of an arc chamber 100 may be convexly formed along lines of magnetic force 130, thermoelectrons 135 move parallel to the body 140 of the arc chamber 100 so that they may not be consumed within the body 140, and instead, may be conserved.

Figure 9:
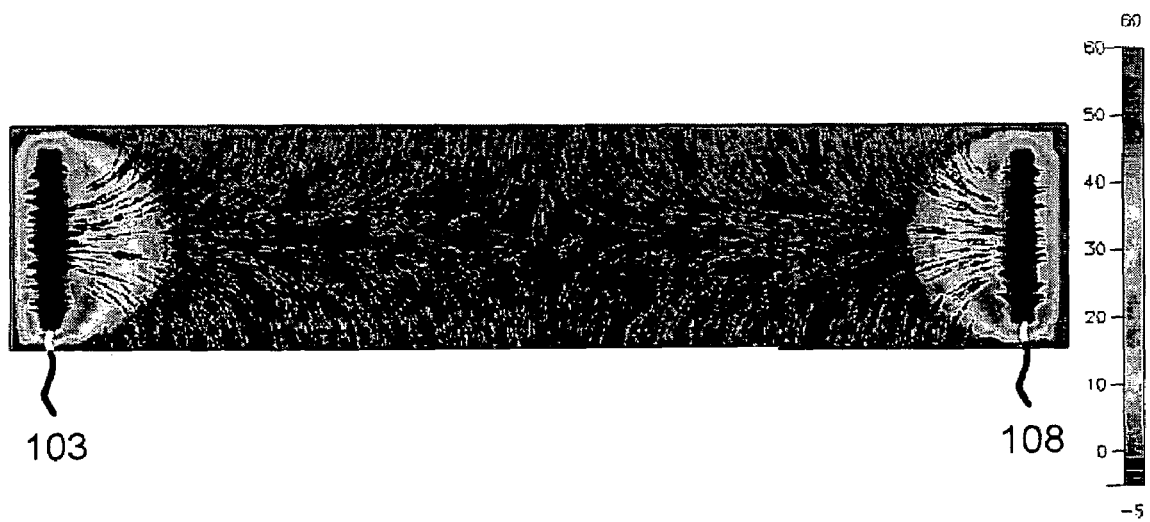
FIG. 9 presents a diagram providing simulated distributions of electric fields in the arc chamber of the ion implanter according to some embodiments of the present invention.

FIG. 9 presents a diagram simulating distribution of electric fields in the arc chamber of an ion implanter according to some embodiments of the present invention. More specifically, when a voltage of 60 V was applied to a body of an arc chamber and a repeller voltage of −5 V was applied to a repeller 108, FIG. 9 shows a simulation of distribution of electric fields in the arc chamber. Referring to FIG. 9, there is little to no charge potential gradient in the center of the arc chamber, and most of the charge potential drop occurs in the repeller 108 or an electrode 103 near the filament. Also, electric field vectors (E) are orthogonal or parallel to inner walls of the arc chamber in most regions. In view of the foregoing, it may be concluded that the movement of thermoelectrons near the inner walls of the arc chamber may depend upon the distribution of magnetic field vectors (B) near the inner walls of the arc chamber. Accordingly, when the magnetic field vectors (B) are parallel to the inner walls of the arc chamber, the loss of thermoelectrons in the body of the arc chamber may be reduced.

Figure 10:
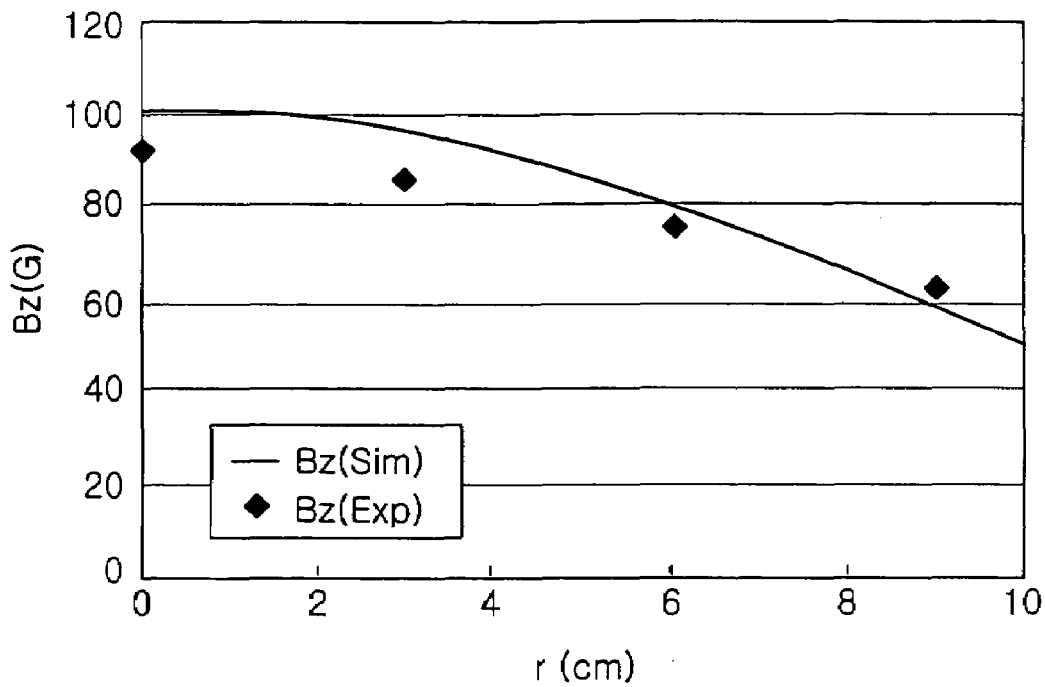
FIG. 10 presents a graph of a magnetic field vector with respect to an r-directional distance in the arc chamber of the ion implanter according to some embodiments of the present invention.
Figure 11:
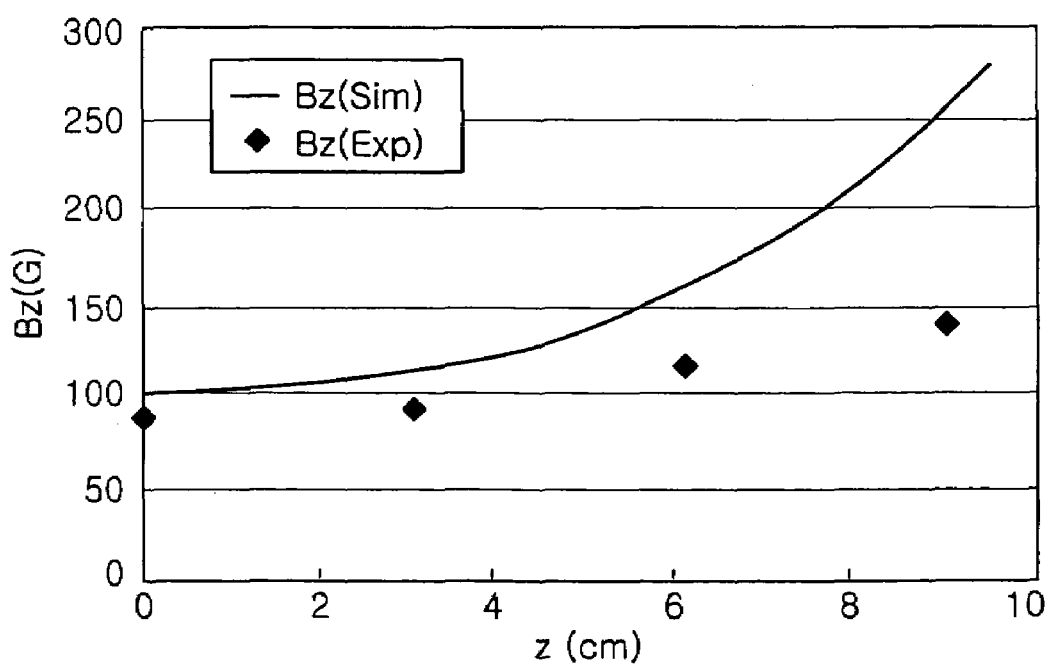
FIG. 11 presents a graph of a magnetic field vector with respect to a z-directional distance in the arc chamber of the ion implanter according to some embodiments of the present invention.

FIG. 10 presents a graph of magnetic field vectors with respect to an r-directional distance in the arc chamber of an ion implanter according to some embodiments of the present invention, and FIG. 11 presents a graph of magnetic field vectors with respect to a z-directional distance in the arc chamber of an ion implanter according to some embodiments of the present invention.

In order to analyze the distribution of magnetic fields due to an electromagnet installed in an arc chamber of an ion implanter according to some embodiments of the present invention, assuming that the electromagnet includes a circular coil, magnetic field vectors were 2-dimensionally simulated in an r-z coordinate system and compared with a z-directional distribution (Bz) of magnetic fields, which was measured using a Gauss Meter. Referring to FIG. 11, it can be noted that error is gradually greater near a z-directional edge than in the center of the arc chamber. An r direction refers to a direction from the center of the arc chamber toward an extraction slit. In FIGS. 10 and 11, Bz(exp) denotes a measured result, while Bz(sim) denotes a simulated result.

Figure 12:
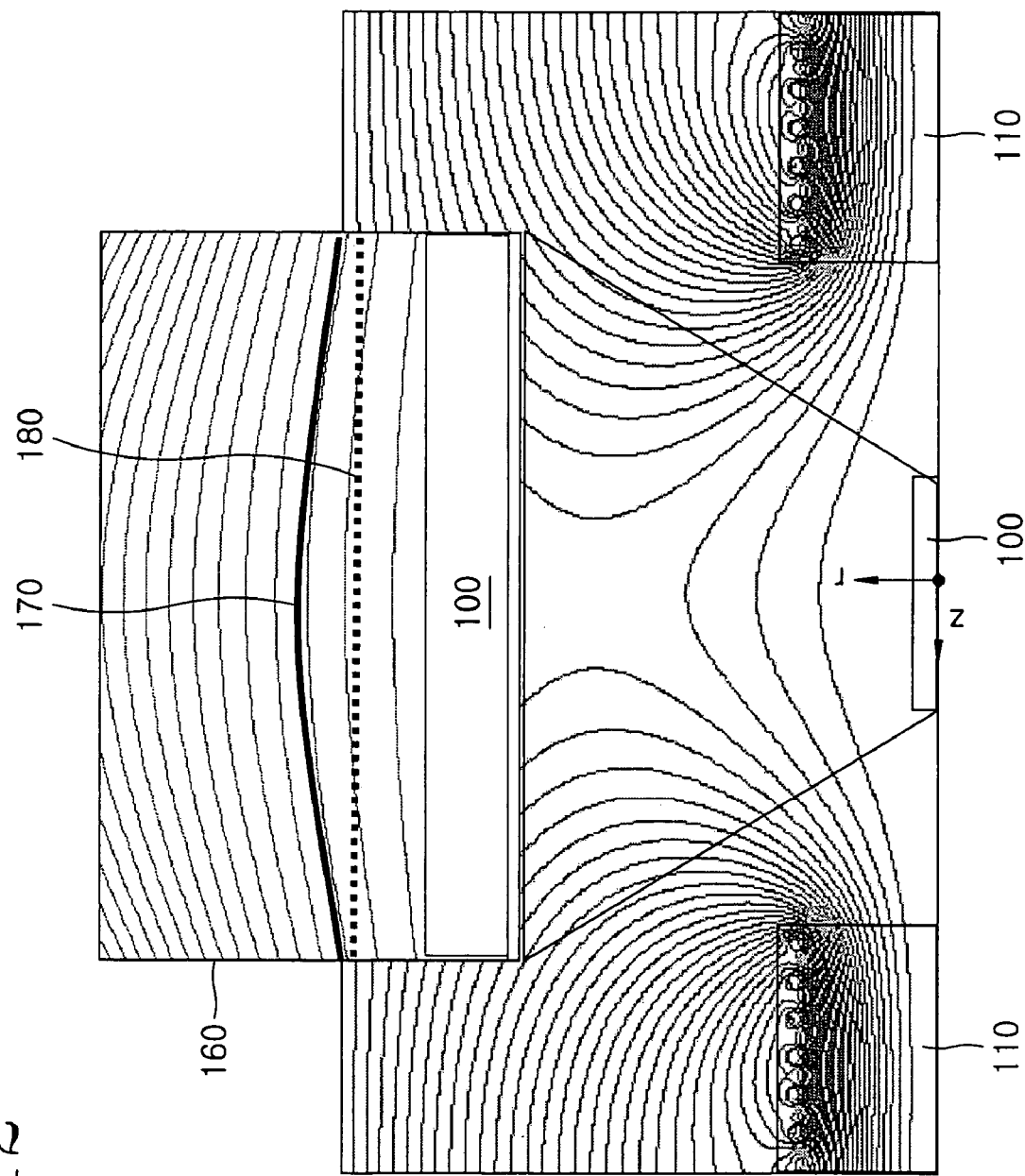
FIG. 12 presents a graph showing the distribution of magnetic fields in the arc chamber of the ion implanter according to some embodiments of the present invention.

FIG. 12 presents a graph of distribution of magnetic fields in the arc chamber of an ion implanter according to some embodiments of the present invention.

In order to analyze the distribution of magnetic fields due to an electromagnet 110 installed in an arc chamber 100 of an ion implanter according to some embodiments of the present invention, assuming that the electromagnet 110 includes a circular coil, a distribution of magnetic field vectors was 2-dimensionally simulated. In FIG. 12, diagram 160 is an enlarged view of magnetic fields around the arc chamber 100. If the diameter of the arc chamber 100 is increased by a multiple of two, in order to minimize the loss of thermoelectrons, the curvature of a body or inner wall of the arc chamber 100 can be calculated from the distribution of magnetic fields around the arc chamber 100 as illustrated with reference numeral 170. In FIG. 12, reference numeral 180 denotes a line of magnetic force of a conventional ion implanter.

Figure 13:
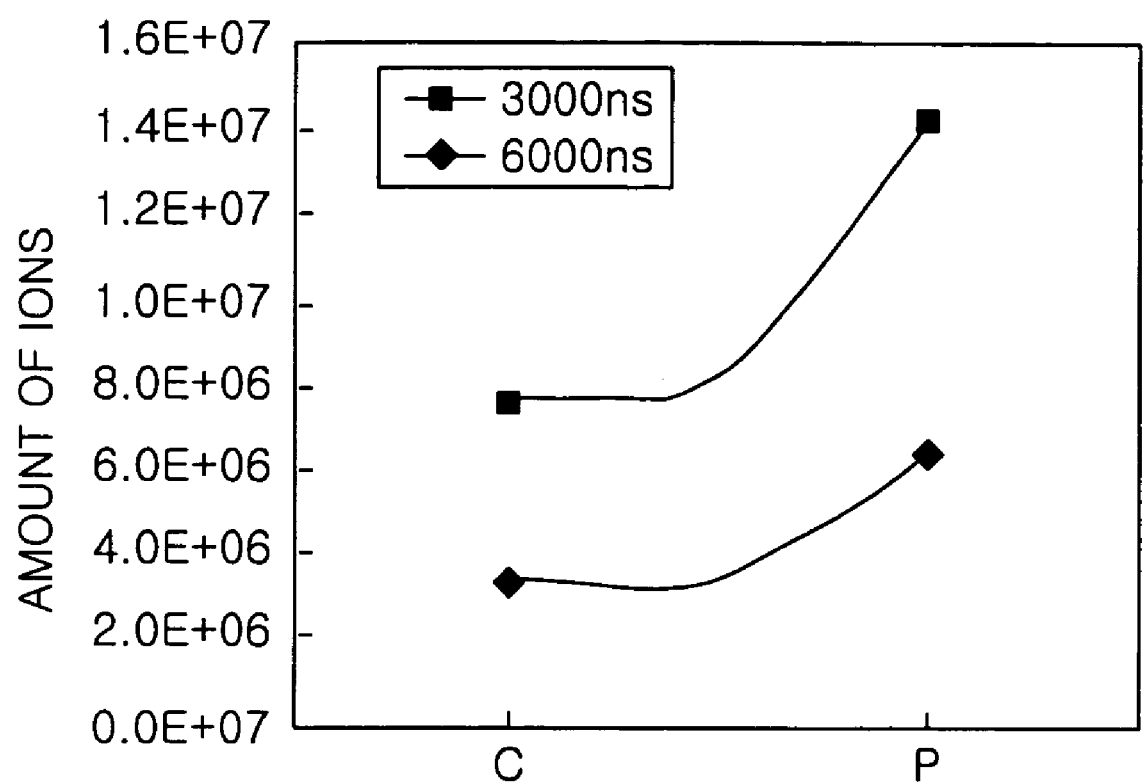
FIG. 13 presents a graph providing simulated quantities of ions emitted from extraction slits of an ion implanter including a conventional arc chamber (C) and an ion implanter including the arc chamber according to some embodiments of the present invention (P).

FIG. 13 presents a graph simulating the quantity of ions emitted from extraction slits of an ion implanter including a conventional arc chamber and an ion implanter including an arc chamber according to some embodiments of the present invention. More specifically, it can be noted from FIG. 13 that the ion implanter including the arc chamber according to some embodiments of the present invention provides greater quantity of emitted ions to the ion implanter including the conventional arc chamber. In other words, the amount (P) of emitted ions of the ion implanter including the arc chamber according to some embodiments of the present was about 46% greater than the amount (C) of emitted ions of the ion implanter including the conventional arc chamber. In FIG. 13, a lozenge and a square represent data points for an embodiment where the entire simulation time was 3000 ns and an embodiment where the entire simulation time was 6000 ns, respectively.

As described above, in an ion implanter according to some embodiments of the present invention, since the body or inner wall of the arc chamber may be convexly formed along the lines of magnetic force, thermoelectrons may not be consumed within the body and thus, can be conserved. As a result, ion implanters according to some embodiments of the present invention may improve the current density of positive ions emitted from the arc chamber.

Additionally, the arc chamber according to some embodiments of the present invention include an arc chamber having the body or inner wall, which is convexly formed along the outmost lines of magnetic force penetrating the filament and the repeller. Accordingly, thermoelectrons may not be consumed within the body so that the arc chamber according to some embodiments of the present invention may be expanded to increase the ion current density.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. An ion implanter comprising:
   an arc chamber comprising at least a first inner region and a second inner region;
   an electron emitting device disposed in the arc chamber adjacent the first inner region and adapted to emit electrons;
   an electron returning device disposed in the arc chamber adjacent the second inner region and adapted to return at least some of the electrons emitted from the electron emitting device into the second inner region; and
   an electric field and magnetic field generating device adapted to provide a magnetic field to the arc chamber,
   wherein at least one inner wall of the arc chamber has a convex surface.

2. The ion implanter of claim 1, wherein the electron emitting device and the electron returning device are spaced apart along an axis and positioned at opposite sides of the arc chamber.

3. The ion implanter of claim 1, wherein the arc chamber comprises at least one inner wall extending between the electron emitting device and the electron returning device and further having a convex surface.

4. The ion implanter of claim 1 wherein the electric field and magnetic field generating device is disposed external to the arc chamber.

5. The ion implanter of claim 1, wherein the electrons emitted from the electron emitting device are thermoelectrons.

6. An ion implanter comprising:
   an arc chamber comprising at least a first inner region and a second inner region;
   an electron emitting device disposed in the arc chamber adjacent the first inner region and adapted to emit electrons;
   an electron returning device disposed in the arc chamber adjacent the second inner region and adapted to return at least some of the electrons emitted from the electron emitting device into the second inner region;
   an electric field and magnetic field generating device adapted to direct outward lines of magnetic force along at least one inner wall of the arc chamber in a convex distribution pattern,
   wherein the at least one inner wall of the arc chamber is disposed parallel to the lines of magnetic force applied between the electron emitting device and the electron returning device.

7. The ion implanter of claim 6, wherein the arc chamber comprises at least one inner wall extending between the electron emitting device and the electron returning device.

8. The ion implanter of claim 6, wherein the electric field and magnetic field generating device is disposed external to the arc chamber.

9. The ion implanter of claim 6, wherein the electrons emitted from the electron emitting device are thermoelectrons.

10. An ion implanter comprising:
    an arc chamber comprising at least a first inner region and a second inner region;
    an electron emitting device disposed in the arc chamber adjacent the first inner region and adapted to emit electrons;
    an electron returning device disposed in the arc chamber adjacent the second inner region and adapted to return at least some of the electrons emitted from the electron emitting device into the second inner region; and
    an electric field and magnetic field generating device disposed external to the arc chamber and adapted to direct outward lines of magnetic force in a convex distribution pattern in a direction between the electron emitting device and the electron returning device and away from the interior of the arc chamber,
    wherein the arc chamber comprises at least one inner wall conformed to the outermost lines of magnetic force applied between the electron emitting device and the electron returning device.

11. The ion implanter of claim 10, wherein the arc chamber comprises at least one inner wall extending between the electron emitting device and the electron returning device.

12. An ion implanter comprising:
    an arc chamber comprising at least a first inner region and a second inner region;
    an electron emitting device disposed in the arc chamber adjacent the first inner region and adapted to emit electrons;
    an electron returning device disposed in the arc chamber adjacent the second inner region and adapted to return at least some of the electrons emitted from the electron emitting device into the second inner region; and
    an electric field and magnetic field generating device disposed external to the arc chamber and adapted to direct outward lines of magnetic force in a convex distribution in a direction away from the interior of the arc chamber,
    wherein the arc chamber comprises at least one inner wall having a convex surface thereby reducing the loss of electrons in a region where the lines of magnetic force intersect the at least one inner wall.

13. The ion implanter of claim 12, wherein the arc chamber comprises at least one inner wall extending between the electron emitting device and the electron returning device.

14. The ion implanter of claim 12, wherein the electrons emitted from the electron emitting device are thermoelectrons.

15. An ion implanter comprising:
    an arc chamber comprising at least a first inner region and a second inner region;
    an electron emitting device disposed in the arc chamber adjacent the first inner region and adapted to emit electrons;
    an electron returning device disposed in the arc chamber adjacent the second inner region and adapted to return at least some of the electrons emitted from the electron emitting device into the second inner region; and
    an electric field and magnetic field generating device disposed external to the arc chamber and adapted to direct outward lines of magnetic force in a convex distribution pattern in a direction away from the interior of the arc chamber; and a tool adapted to conform at least one inner wall of the arc chamber to the lines of magnetic force in the arc chamber applied between the electron emitting device and the electron returning device.

16. The ion implanter of claim 15, wherein the tool is comprised of the material comprising the at least one inner wall.

17. The ion implanter of claim 15, wherein the tool is adapted to provide a convex surface to the at least one inner wall.

18. The ion implanter of claim 15, wherein the arc chamber comprises at least one inner wall extending from the electron emitting device and the electron returning device.

19. The ion implanter of claim 15, wherein the electrons emitted from the electron emitting device are thermoelectrons.

20. An ion implanter comprising:

an arc chamber comprising at least a first inner region and a second inner region;

an electron emitting device disposed in the arc chamber adjacent the first inner region and adapted to emit thermoelectrons;

an electron returning device disposed in the arc chamber adjacent the second inner region and adapted to return at least some of the thermoelectrons emitted from the electron emitting device into the second inner region; and an electric field and magnetic field generating device disposed external to the arc chamber;

a gas supply system adapted to direct a source gas into the arc chamber; and an ion extraction outlet extending through a sidewall of the arc chamber adapted to extract ions from the arc chamber, wherein a positive voltage is applied to at least one inner wall of the arc chamber to accelerate the thermoelectrons emitted from an electron emitting device thereby providing energy to the thermoelectrons for ionization of the source gas, and wherein the at least one inner wall of the arc chamber has a convex surface thereby reducing the loss of thermoelectrons in a region where lines of magnetic force provided by the electric field and magnetic field generating device intersect the at least one inner wall.

21. The ion implanter of claim 20, wherein the arc chamber further comprises a second inner wall extending between the electron emitting device and the electron returning device.

* * * * *